United States Patent [19]

Davidson et al.

[11] Patent Number: 5,414,355
[45] Date of Patent: May 9, 1995

[54] MAGNET CARRIER DISPOSED WITHIN AN OUTER HOUSING

[75] Inventors: Robert M. Davidson, Freeport; William E. Eaton, Stockton; Gregory R. Furlong, Freeport; Scott E. Michelhaugh, Cedarville; James W. Rowley, German Valley; Gordon F. Ross; Danny R. Schoening, both of Freeport; Daryl L. Tessmann, Ridott; David W. Ulz, Freeport, all of Ill.

[73] Assignee: Honeywell Inc., Minneapolis, Minn.

[21] Appl. No.: 205,668

[22] Filed: Mar. 3, 1994

[51] Int. Cl.$^6$ .................. G01B 7/30; G01P 3/488; H05K 5/00
[52] U.S. Cl. ................... 324/207.2; 324/174; 123/617; 174/52.3
[58] Field of Search ............ 324/173, 174, 207.15, 324/207.16, 207.2, 207.21; 73/DIG. 3; 123/617; 174/52.3, 52.5, 52.6

[56] References Cited

U.S. PATENT DOCUMENTS

| 4,829,834 | 5/1989 | Masom | 324/174 X |
| 4,994,739 | 2/1991 | Honda et al. | 324/207.2 X |
| 5,070,298 | 12/1991 | Honda et al. | 324/207.2 |
| 5,121,289 | 6/1992 | Gagliardi. | |
| 5,140,262 | 8/1992 | Stolfus | 324/207.2 |
| 5,278,496 | 1/1994 | Dickmeyer et al. | 324/174 |

FOREIGN PATENT DOCUMENTS 0110122 6/1984 European Pat. Off. ......... 324/207.2

Primary Examiner—Gerard R. Strecker
Attorney, Agent, or Firm—William D. Lanyi

[57] ABSTRACT

A magnetic sensor is provided with a housing in which a carrier is inserted. The carrier is particularly shaped to retain a permanent magnet in a particular position relative to a plurality of electrical conductors and a substrate on which a magnetically sensitive component is attached. The carrier and its associated components is inserted into a housing which can be deformed to permanently retain the carrier within a cavity of the housing. All of the components of the sensor are designed to be easily assembly along a common axis to facilitate automatic assembly and manufacture of the sensor. The magnetically sensitive component can be a Hall effect element that is associated with other electrical components which are also attached to a substrate that is disposed proximate a front end of the carrier.

13 Claims, 4 Drawing Sheets

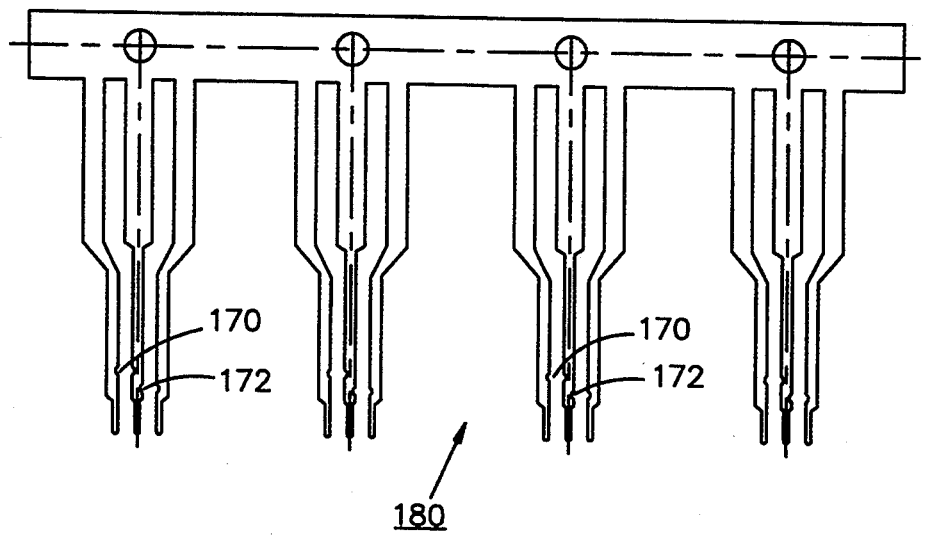
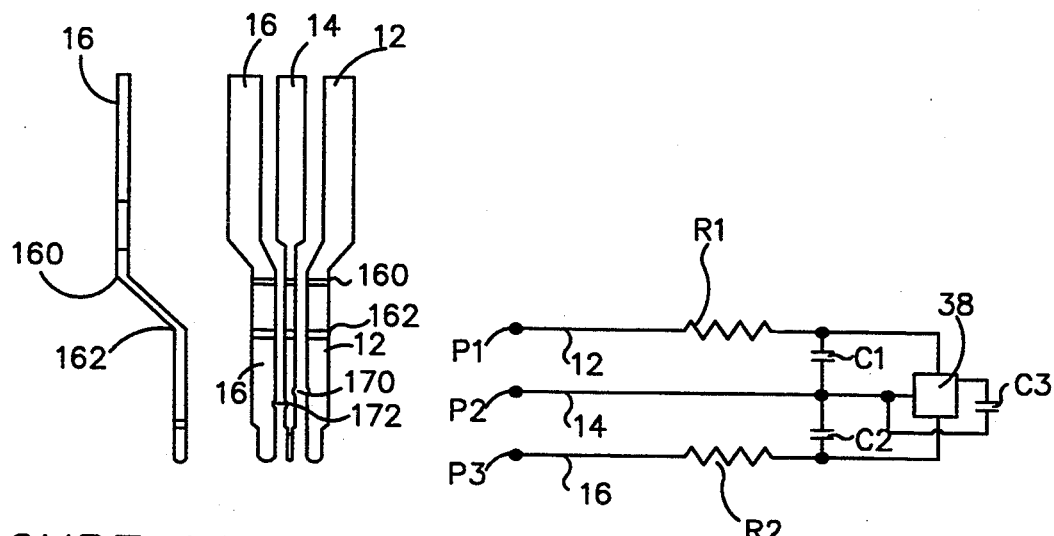

MAGNET CARRIER DISPOSED WITHIN AN OUTER HOUSING

BACKGROUND OF THE INVENTION

1. Field of the Invention

The present invention is generally related to magnetic sensors and, more particularly, to a sensor which comprises a molded insert that is shaped to be received within a metallic housing and which comprises a plurality of components that are specifically designed to facilitate assembly of the individual component parts of the sensor.

2. Description of the Prior Art

Magnetic sensors which incorporate Hall effect elements are well known to those skilled in the art. Sensors of this type are commonly used to detect the movement of magnetically permeable objects within a predefined detection zone proximate the sensor. For example, sensors of this general type are used to detect the passage of gearteeth or other magnetic protrusions extending from a rotatable object for the purpose of synchronizing the operation of various elements of an internal combustion engine. When applied in this manner, a magnetic geartooth sensor can be used to detect the rotational position of a cam shaft or other rotatable components of an internal combustion engine in order to provide the necessary signals to control the timing of the engine.

Geartooth sensors are made in several known ways. One type of geartooth sensor attaches a flexible circuit, with a Hall element attached to it, to a plastic insert which is disposed within a plastic tube. The flexible circuit is connected in electrical communication with several components, including the Hall effect element. After the insert is disposed within the plastic housing, a quantity of curable material is injected into the housing around the insert and other components and is then cured to rigidly and permanently contain the insert and related components within the housing. One disadvantage of this type of sensor is that the curing of the injected material requires a considerable time and also requires the use of a curing oven. These additional operations often require cleaning and are time consuming and costly. In addition, the frequent cleaning often requires solvents which may be harmful to the environment.

Whenever a geartooth sensor is manufactured through the use of the processes described above, the outer shape of the finished product typically must conform to a predetermined configuration that is dictated by the end use of the product. Each application of a geartooth sensor with an internal combustion engine can require a particular shape and size of the geartooth sensor so that it can be properly attached to an external object, such as the engine block or related apparatus. Regardless of the particular means used to encapsulate the geartooth sensor and determine its ultimate outer shape, the internal components of the geartooth sensor must be protected during the preliminary assembly operation prior to being potted within a plastic housing or injection molded within an outer protective housing. It would therefore be beneficial to provide a geartooth sensor which comprises an intermediate assembly configuration that is sufficiently robust to withstand both a harsh environment and rigorous handling during subsequent manufacturing processes.

U.S. Pat. No. 5,121,289, which issued to Gagliardi on Jun. 9, 1992, describes an encapsulatable sensor assembly that includes an external housing with several internal support components that are used to retain an active sensor element and an associated electrical circuit in a predetermined relationship with each other while providing a plurality of internal sequential interconnected cavities for facilitating a flow of an encapsulating material from an injection port to a vented overflow port. This assures a complete fill of the internal cavities in order to restrain the internal components within the housing. The sensor assembly provides a structure for a void free encapsulation.

U.S. Pat. No. 5,140,262, which issued to Stolfus on Aug. 18, 1992, discloses a geartooth sensor that is shaped to have its centerline placed in non intersecting relation with a center of rotation of a rotatable member. Although the Stolfus patent does not particularly show a means for encapsulation, it illustrates a geartooth sensor with a housing in which the active components of the sensor are disposed. Both the Gagliardi and Stolfus patents illustrate geartooth sensors of the general type which typically inject an encapsulant into the housing to rigidly maintain the location of the various components of the geartooth sensor. The encapsulant must then be cured in some way.

SUMMARY OF THE INVENTION

The present invention provides a magnetic sensor which disposes a carrier within a housing without the use of curable materials, such as those which are available in commercial quantities from the Dexter Corporation, and without the requirement of an injection molded housing. A preferred embodiment of the present invention comprises a carrier which has a front end, a back end and an opening formed within its structure. In a particularly preferred embodiment of the present invention, the carrier is made of molded plastic. A plurality of electrical conductors extend from the front end of the carrier to the back end of the carrier and, in a particularly preferred embodiment of the present invention, the electrical conductors are molded within the body of the carrier.

A permanent magnet is disposed in the opening that is formed within the carrier and a magnetically sensitive component is disposed at the front end of the carrier. The magnetically sensitive component, which can be a Hall effect element, is connected in electrical communication with at least one of the plurality of electrical conductors that extend from the front end of the carrier. A housing is shaped to receive the carrier and its related components within its internal cavity and a sealing means, such as an O-ring, is provided for the purpose of preventing contaminants from entering the cavity of the housing in the vicinity of the magnetically sensitive component.

If the housing is made of an electrically conductive material, such as stainless steel, a spacer means is provided within the cavity of the housing for preventing electrical communication between the magnetically sensitive component and the housing. This spacer means can be an elastomeric washer made of silicone rubber. In one particularly preferred embodiment of the present invention, a substrate is disposed in contact with the front end of the carrier and the magnetically sensitive component is attached to the substrate. The substrate can be made of ceramic material or, alternatively, can be a flexible circuit or a printed circuit board. To facilitate the insertion of the carrier into the housing while also maintaining a close tolerance between the outer shape of the carrier and the inner surface of the housing, an air passage is formed in a portion of the carrier to prevent the buildup of pressure between the front end of the carrier and the closed end of the housing during the insertion process.

Although the open end of the housing can be deformed to rigidly retain the carrier within it, an alternative embodiment of the present invention provides an injection molded outer covering around the housing in order to further protect the magnetically sensitive component from possible contaminants and damage. In addition, the injection molded covering can be used to define a particular shape of the geartooth sensor so that it can be applied in association with particularly shaped components of an internal combustion engine.

BRIEF DESCRIPTION OF THE DRAWINGS

The present invention will be more fully understood from a reading of the Description of the Preferred Embodiment in conjunction with the drawings, in which:

FIG. 12 is an electrical schematic of one embodiment of a magnetic sensor made in accordance with the present invention;

FIGS. 13 and 14 show the electrical conductors used in conjunction with the present invention; and FIG. 15 shows several sets of electrical conductors connected to a common structure for purposes of mass production of the present invention.

DESCRIPTION OF THE PREFERRED EMBODIMENT

Figure 1:
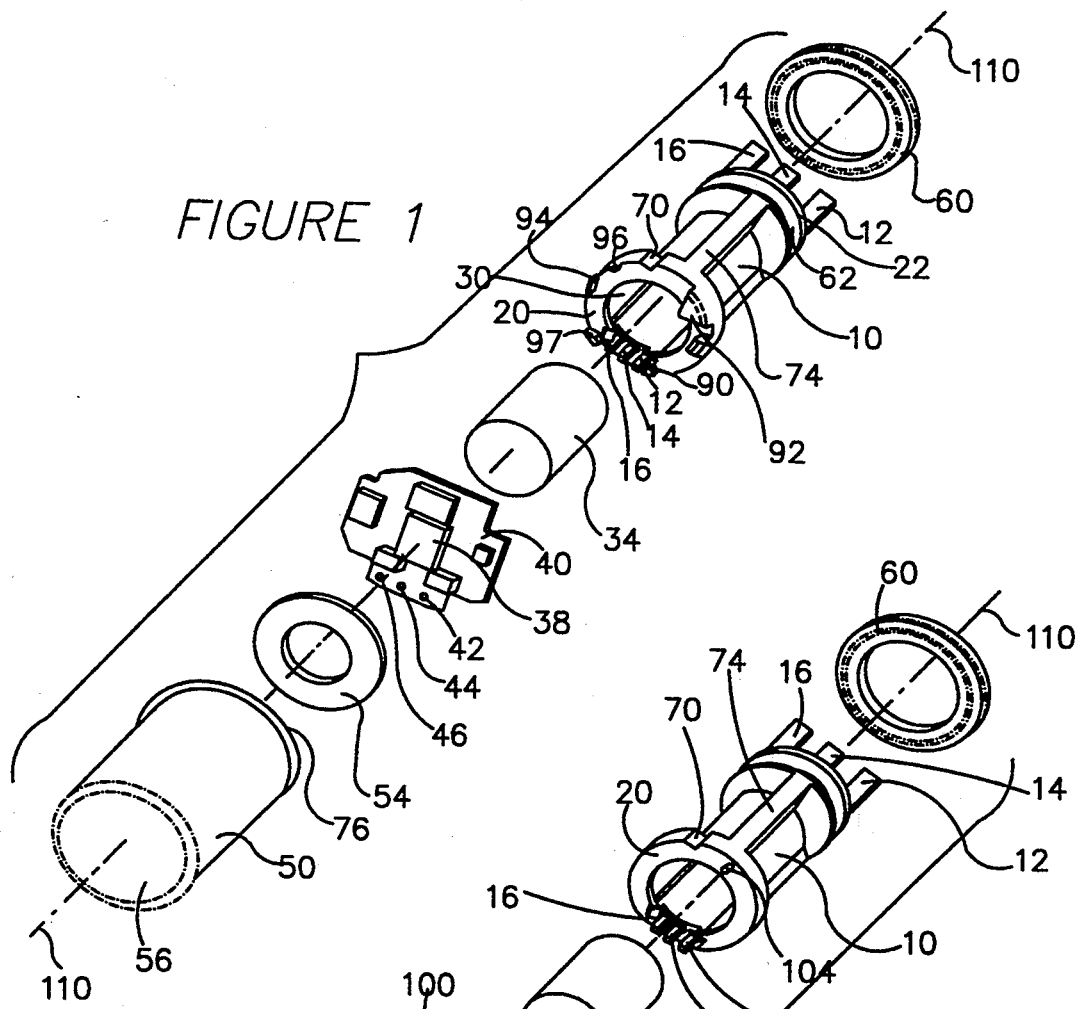
FIG. 1 is an exploded view of one embodiment of the present invention.

Throughout the Description of the Preferred Embodiment, like components will be identified with like reference numerals.

FIG. 1 shows an exploded view of one particularly preferred embodiment of the present invention. A carrier 10 has a plurality of electrical conductors, 12, 14 and 16, molded within its body. The carrier 10 has a front end 20 and a back end 22. The electrical conductors, 12, 14 and 16, extend completely through the length of the carrier 10 and also extend outward from both the front and back ends as shown in FIG. 1. An opening 30 is formed within the carrier 10. The opening 30 is shaped to receive a magnet 34 within it. The magnet 34 can be a sintered permanent magnet or a molded permanent magnet. Molded magnets comprising neodymium, boron and iron are known to those skilled in the art and are commercially available. Molded magnets permit increased efficiency of manufacture and also provide a high degree of dimensional accuracy that often does not require grinding or shaping following the molding process. Magnets comprising neodymiun, boron and iron provide a significant difference between tooth and slot conditions when used in a geartooth sensor. In addition, molded magnets exhibit an improved temperature stability for the difference between teeth and slots and an increased magnetic strength compared to most known sintered magnets. Although a preferred embodiment of the present invention provides an opening 30 and uses a magnet 34 that is inserted into the opening, it should be understood that the carrier 10 could be molded around the magnet 34.

With continued reference to FIG. 1, a magnetically sensitive component 38 is disposed at the front end of the carrier 10 and is attached to a substrate 40. Although not particularly shown in FIG. 1, the substrate 40 is provided with a plurality of conductive portions that permit the magnetically sensitive component 38 to be connected in electrical communication with the electrical conductors, 12, 14 and 16. The portions of the electrical conductors that extend from the front end of the carrier 10 are received in openings, 42, 44 and 46, formed in the substrate 40. Other components, which will be described in greater detail below, are also attached to the substrate 40 and connected in electrical communication with the magnetically sensitive component 38 and the electrical conductors.

A housing 50 is shaped to receive the assembly of the carrier 10, the permanent magnet 34 and the substrate 40. The housing 50 can be made of a metal, such as stainless steel, or plastic. The material used to make the housing 50 can be selected of any suitable material that is capable of performing the intended sensing function for a particular application. If the housing 50 is made of an electrically conductive material, such as stainless steel, a spacer 54 can be used to prevent electrical communication between the components on the substrate 40 and the closed end 56 of the housing 50.

Since the sensor operates by detecting the strength and direction of a magnetic field, the material selected to be used for the housing 50 should be of a low magnetic permeability. One particular type of material that is applicable for this purpose is 304 grade stainless steel, When formed into the shape of the housing 50, this material has been determined to exhibit satisfactory magnetic characteristics.

A means is provided for preventing contaminants from entering the space within the housing 50 proximate the magnetically sensitive component 38 and its related electrical components. This means is provided by an O-ring 60 that is disposed around the carrier 10 within a groove 62. The size and shape of the sealing means 60 is selected to provide an adequate seal between the inner surface of the housing 50 and the carrier 10.

In a particularly preferred embodiment of the present invention, an air passage 70 is formed in the carrier 10 to permit air to flow through the front end 20 of the carrier 10 and prevent the buildup of pressure within the housing 50 as the carrier is inserted into it. Since it is advantageous to provide a relatively close fit between the outer dimension of the carrier 10 and the inner dimension of the housing 50, the air passage 70 prevents an increase in pressure within the housing as the carrier 10 is being inserted into it. Without this air passage 70, the insertion process could be difficult and could possibly necessitate a larger clearance between the outer dimension of the carrier and the inner dimension of the housing. In order to further facilitate this assembly process, a rib 74 is provided as part of the outer shape of the carrier 10. The rib 74 prevents the front lip 76 of the housing 50 from catching on the housing structure.

Figure 2:
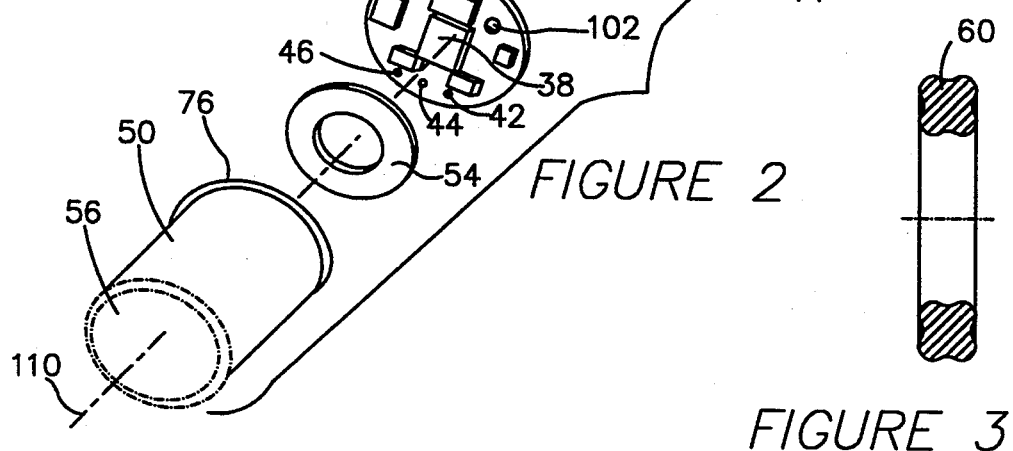
FIG. 2 is an exploded view of an alternative embodiment of the present invention.

FIG. 2 shows an alternative embodiment of the present invention. The difference between the embodiments shown in FIGS. 1 and 2 are relatively minor. The substrate 40 shown in FIG. 1 is particularly shaped to correspond to a plurality of protrusions formed in the front end 20 of the carrier 10. These protrusions, identified by reference numerals 90, 92, 94, 96 and 97, correspond to the shape of the outer edge of substrate 40 and, in conjunction with the electrical conductors, 12, 14 and 16 which extend from the front end 20 of the carrier, help to align the magnetically sensitive component 38 at its proper position with respect to the closed end 56 of the housing.

Figure 3:
FIG. 3 is a sectional view of a sealing means used in conjunction with the present invention.

The embodiment shown in FIG. 2 replaces the substrate 40 with a generally round substrate 100 which is not provided with the particularly shaped outer edge shown on substrate 40 in FIG. 1. Instead, the substrate 100 shown in FIG. 2 is provided with an opening 102. In addition, the carrier 10 in FIG. 2 is not provided with the protrusions extending from its front end. Instead, a single pin 104 is formed at the front end of the carrier and is shaped to be received in opening 102. The substrate 100 can therefore be satisfactorily aligned relative to the carrier 10 by the positions of pin 104 and electrical conductors, 12, 14 and 16, which are inserted into opening 102 and openings 42, 44 and 46. Other than these differences between substrate 40, substrate 100 and the front ends of the carriers shown in FIG. 1 and FIG. 2, the two embodiments are generally identical to each other. FIG. 3 is a cross sectional view of the sealing means 60 which is an O-ring that is provided with appropriate fluting to increase its sealing capability when used in conjunction with the carrier 10 and the housing 50.

With reference to FIGS. 1 and 2, it can be seen that all of the components of the present invention are assembled in a direction along a central axis 110. This consistent direction of assembly of the components relative to each other and relative to the housing 50 facilitate automatic assembly processes. The present invention was particularly designed to permit the individual components to be assembled with respect to each other along this common axis.

Figure 4:
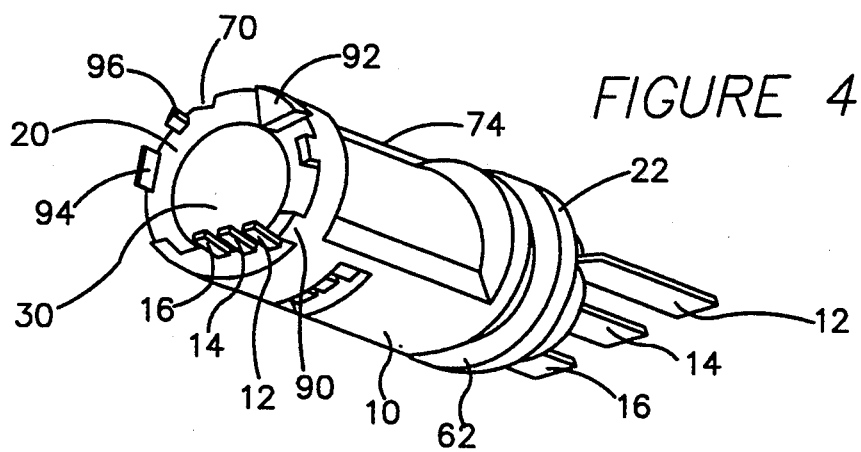
FIG. 4 is a perspective view of the carrier of the present invention.
Figure 5:
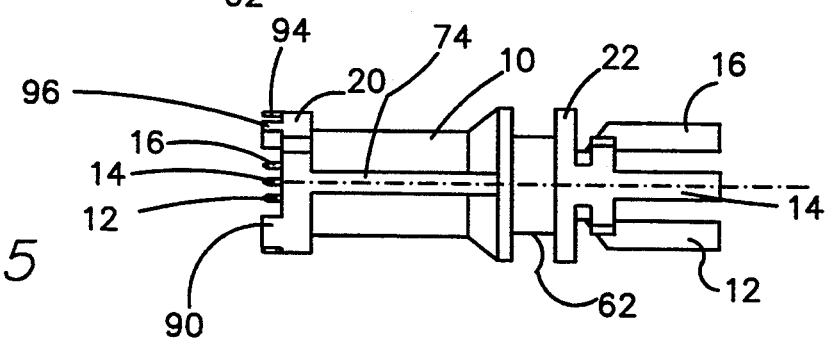
FIG. 5 is a top view of the carrier shown in FIG. 4.

FIG. 4 is a perspective view of the carrier 10 of the present invention. FIG. 5 shows a top view of the carrier 10. The rib 74 can be seen extending between the front end 20 and the back end 22 for the purposes described above. In addition, the groove 62 is shown extending around the periphery of the carrier 10 for the purpose of receiving the O-ring 60.

Figure 6:
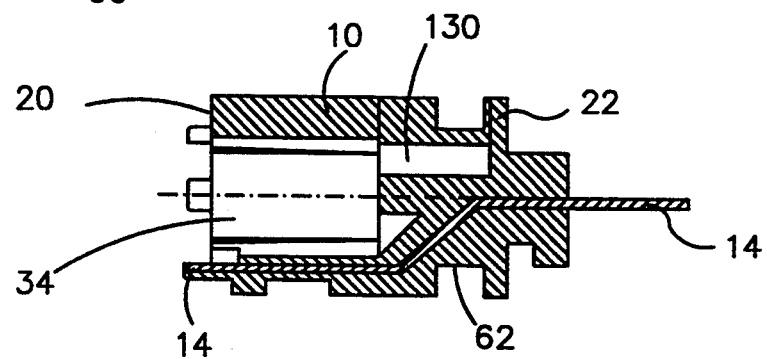
FIG. 6 is a sectional view of a carrier of the present invention.

FIG. 6 is a sectional view of the carrier 10 and the permanent magnet 34 disposed within it. FIG. 6 illustrates the shape of electrical conductor 14. As can be seen, the electrical conductor 14 is bent at two places to result in a structure that has two ends which are arranged in parallel association with each other, but are intentionally nonaligned. This nonalignment of its ends provides a significant advantage in maintaining the integrity of the overall sensor. The electrical conductors, 12, 14 and 16, are typically made of a material that has a different coefficient of thermal expansion than the material used to make the carrier 10. Since many applications of geartooth sensors require that the sensor be able to withstand wide ranges of temperature conditions, the electrical conductors and the carrier 10 will likely experience different degrees of expansion. For example, the electrical conductors, 12, 14 and 16, are typically made of copper or phosphorous bronze while the carrier 10 is typically made of a moldable thermoplastic, such as reinforced polyetherimide or reinforced polybutyleneterephthalate. As the sensor experiences the severe changes in temperature, the conductors and the carrier may expand at significantly different rates. The shape of the electrical conductors, shown in FIG. 6, help to retain them within the body of the carrier 10 during these changes in dimension. If the electrical conductors extended through the carrier 10 along a straight line, the thermal expansion and contraction could separate the outer surface of the electrical conductors from the carrier material immediately surrounding them and this separation could result in a leakage path between the back end 22 of the carrier 10 and its front end 20. This leakage path could permit contaminants, such as gasoline or oil, to penetrate into the space between the front end 20 of the carrier and the closed end 56 of the housing 50. The double bend formed in the electrical conductors helps to prevent this separation between them and the surrounding material of the carrier 10.

With continued reference to FIG. 6, it can be seen that a space 130 is formed in the carrier and located at the bottom of the internal cavity of the carrier 10. This space and other spaces formed within the structure of the carrier 10 are advantageously disposed at positions which facilitate the injection molding process used to form the carrier while preventing distortions as the material hardens.

Figure 7:
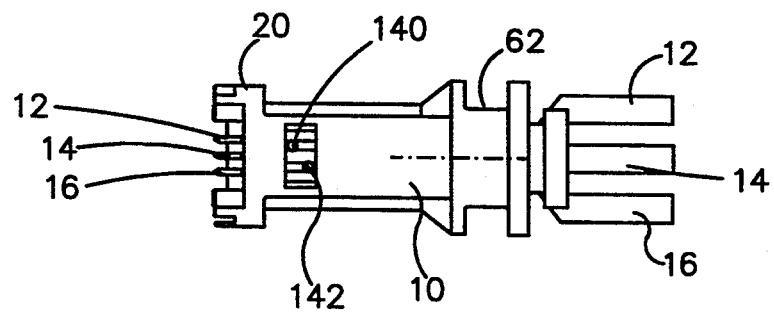
FIG. 7 is a bottom view of the carrier shown in FIG. 4.

FIG. 7 illustrates a bottom view of the carrier 10. The electrical conductors, 12, 14 and 16, can be seen through an opening in the bottom side of the carrier 10. Two holes, 140 and 142, can also be seen in FIG. 7. These holes result from pins that are used during the injection molding process that molds the carrier's shape around the electrical conductors. The electrical conductors are particularly shaped to permit these pins to retain them in their precise positions during the injection molding process which could otherwise misalign them relative to each other and relative to the outer surface configurations of the carrier.

Figure 8:
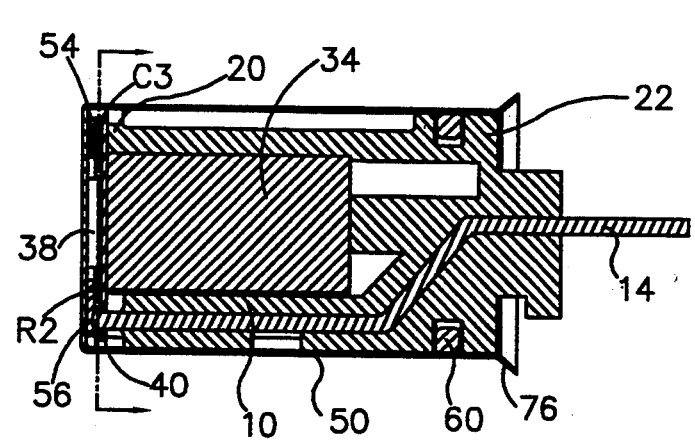
FIG. 8 is a sectional view of the present invention.
Figure 9:
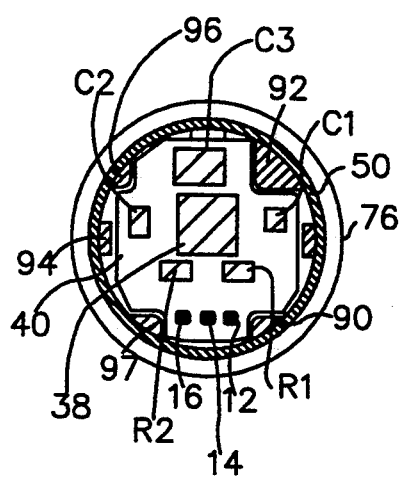
FIG. 9 is an end view of a portion of the present invention shown in FIG. 8.
Figure 10:
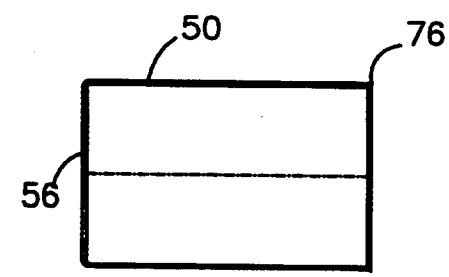
FIG. 10 shows the housing of the present invention.

FIG. 8 shows a sectional view of the carrier 10 disposed within the housing 50. After assembly of the carrier 10 within the housing, the lip 76 of the housing can be deformed and bent over the back end 22 of the carrier to rigidly retain the carrier within the cavity of the housing. FIG. 9 is a sectional view of the illustration shown in FIG. 8. The illustration in FIG. 9 shows the relative positions of the magnetically sensitive component 38, such as a Hall effect element, capacitors C1–C3, and resistors, R1 and R2. Since the magnetically sensitive component 38 is commonly potted within a surrounding plastic case, electrical communication between it and the closed end 56 of the housing 50 is generally unlikely. However, the spacer 54 is useful in preventing electrical communication between the other components on the substrate 40 and the closed end 56 of the housing 50. FIG. 10 is a sectional view of the housing 50 with its closed end 56 and its lip 76 that extends around the open end of the housing.

Figure 11:
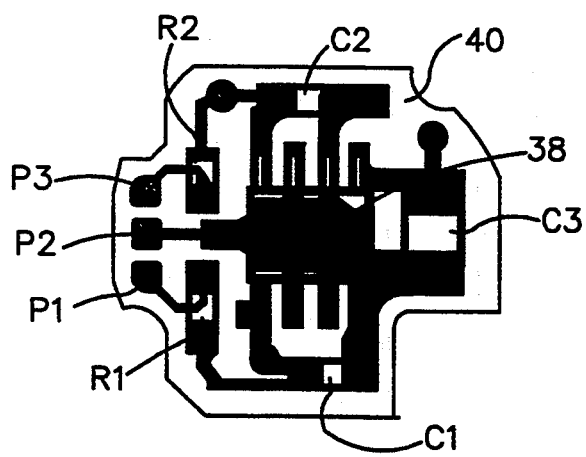
FIG. 11 shows the substrate used in one particular embodiment of the present invention.

FIG. 11 shows the substrate 40 and the positions where the electrical components would be attached to it. The electrical components and the magnetically sensitive component 38 are connected in electrical communication with each other by a plurality of conductive runs which are provided on the surface of the substrate 40. The pads, P1, P2 and P3, are provided for connection between the conductive runs and the electrical conductors, 12, 14 and 16, respectively.

FIG. 12 shows an electrical schematic diagram that illustrates the relative connections between the capacitors, C1, C2 and C3, the resistors, R1 and R2, and the magnetically sensitive component 38. The electrical conductors, 12, 14 and 16, provide a means for connecting the components to an external device, such as an internal combustion engine control system.

FIG. 11 also illustrates another advantage of the present invention. When electrical circuits are possibly subject to electromagnetic interference, or EMI, it has been found that symmetry of design can significantly reduce the adverse effects that could otherwise be caused by the EMI. The components on the substrate 40 are arranged in very close proximity to each other in order to reduce the effects of EMI. In addition, they are also arranged to provide a symmetrical relationship. This arrangement permits the conductive runs on the surface of the substrate 40 to be arranged in a symmetrical pattern. The overall structure of the sensor also permits the substrate 40 to be much smaller than previously known designs which typically incorporate flexible circuits that extend around a portion of a plastic insert. When a long substrate, or flexible circuit, is used, the conductive runs on that substrate or flexible circuit make the overall device much more sensitive to the adverse affects of electromagnetic interference.

FIGS. 13 and 14 show the shapes of the electrical conductors, 12, 14 and 16. The bends, 160 and 162, are provided to prevent the formation of a leakage path through the carrier 10 as described above in conjunction with FIG. 6. The notches, 170 and 172, that are formed in the electrical conductors, are intended to conform with holes 140 and 142 that are described above in conjunction with FIG. 7. The notches cooperate with pins to retain the accurate position of the electrical conductors relative to the carrier 10 during the injection molding process that forms the carrier. FIG. 15 shows a single piece assembly 180 that comprises several sets of electrical conductors. This permits the mass production of the carriers described above. A plurality of carriers can be manufactured during a single injection molding step and then the molded carriers, with the leads enclosed within the carrier's body, can be automatically moved to a subsequent assembly step. The illustration shown in FIG. 15 represents the conductors prior to the bending of the electrical conductors to form bends 160 and 162. The other holes shown in FIG. 15 are used for alignment purposes during the bending and injection molding processes.

The present invention provides a magnetic sensor that facilitates its manufacture in several important ways. For example, all of the individual components used to make the sensor can be assembled relative to each other along a common axis. In addition, the electrical conductors used by the present invention are shaped to inhibit damage from occurring because of the differences in coefficients of thermal expansion between the carrier body and the electrical conductors. A sealing means is provided to prevent contaminants from adversely affecting the operation of the sensor after the carrier is inserted within its housing. The structure of the present invention provides a robust configuration that can easily be handled during subsequent injection molding procedures without damaging the components within the housing 50. These subsequent injection molding procedures can provide an additional structure around the housing to conform to particular requirements for the sensor's intended application. Alternatively, the present invention could be used without a subsequently molded outer coating in certain applications.

Although the present invention has been described with particularly detail and illustrated with a high degree of specificity, it should be understood that alternative embodiments of the present invention are also within its scope. In addition, the particular shapes and configurations shown in the figures and described above should not be considered to be limiting to the scope of the present invention.

The embodiments of the invention in which an exclusive property or right is claimed are defined as follows:

1. A magnetic sensor, comprising:
   a carrier having a front end, a back end and an opening formed within said carrier, said opening extending into said carrier from said front end;
   a plurality of electrical conductors, said plurality of electrical conductors being molded within the body of said carrier and extending from said front end of said carrier to said back end of said carrier, each of said plurality of electrical conductors being bent at two places to dispose its ends in parallel and nonaligned relationship with each other;
   a permanent magnet disposed within said opening formed within said carrier;
   a magnetically sensitive component disposed at said front end of said carrier within a magnetic field of said permanent magnet, said magnetically sensitive component being connected in electrical communication with at least one of said plurality of electrical conductors;
   a housing having an internal cavity, said housing being shaped to receive said carrier within said internal cavity;
   sealing means, disposed between said carrier and said housing, for preventing contaminants from entering said cavity of said housing in the vicinity of said magnetically sensitive component;
   spacer means, disposed within said cavity of said housing, for preventing electrical communication between said magnetically sensitive component and said housing; and
   a substrate disposed in contact with said front end of said carrier, said magnetically sensitive component being attached to said substrate.

2. The sensor of claim 1, wherein:
   said spacer means is an elastomeric washer.

3. The sensor of claim 1, wherein:
   said magnetically sensitive component is a Hall effect element.

4. The sensor of claim 1, wherein:
   said sealing means is a deformable O-ring.

5. The sensor of claim 1, wherein:
   said carrier is provided with an air passage to facilitate its insertion into said housing by preventing pressure buildup between said front end of said carrier and said housing.

6. The sensor of claim 1, wherein:
   said permanent magnet is a molded magnet.

7. A magnetic sensor, comprising:

a molded plastic carrier having a front end, a back end and an opening formed within said molded plastic carrier and extending through said front end;

a plurality of electrical conductors disposed within the body of said molded plastic carrier, said plurality of electrical conductors extending from said front end of said molded plastic carrier and from said back end of said molded plastic carrier, each of said plurality of electrical conductors is bent at two places to dispose its ends in parallel and nonaligned relationship with each other;

a permanent magnet disposed within said opening formed within said carrier;

a magnetically sensitive component disposed at said front end of said molded plastic carrier within a magnetic field of said permanent magnet, said magnetically sensitive component being connected in electrical communication with at least one of said plurality of electrical conductors;

a housing having an internal cavity, said housing being shaped to receive said molded plastic carrier within said internal cavity;

spacer means, disposed within said cavity of said housing, for preventing electrical communication between said magnetically sensitive component and said housing;

sealing means, disposed between said molded plastic carrier and said housing, for preventing contaminants from entering said cavity of said housing in the vicinity of said magnetically sensitive component; and a substrate disposed in contact with said front end of said molded plastic carrier, said magnetically sensitive component being attached to said substrate.

8. The sensor of claim 7, wherein:
said spacer means is an elastomeric washer.

9. The sensor of claim 7, wherein:
said magnetically sensitive component is a Hall effect element.

10. The sensor of claim 7, wherein:
said sealing means is a deformable O-ring.

11. The sensor of claim 7, wherein:
said housing is made of metal and deformed to retain said carrier therein.

12. A magnetic sensor, comprising:

a molded plastic carrier having a front end, a back end and an opening formed within said molded plastic carrier;

a plurality of electrical conductors disposed within the body of said molded plastic carrier, said plurality of electrical conductors extending from said front end of said molded plastic carrier and from said back end of said molded plastic carrier, each of said plurality of electrical conductors being bent at two places to dispose its ends in parallel and nonaligned relationship with each other;

a permanent magnet disposed within said opening formed within said carrier;

a magnetically sensitive component disposed at said front end of said molded plastic carrier within a magnetic field of said permanent magnet, said magnetically sensitive component being connected in electrical communication with at least one of said plurality of electrical conductors;

a housing having an internal cavity, said housing being shaped to receive said molded plastic carrier within said internal cavity;

a substrate disposed in contact with said front end of said molded plastic carrier, said magnetically sensitive component being attached to said substrate;

spacer means, disposed within said cavity of said housing, for preventing electrical communication between said magnetically sensitive component and said housing, said spacer means being an elastomeric washer; and sealing means, disposed between said molded plastic carrier and said housing, for preventing contaminants from entering said cavity of said housing in the vicinity of said magnetically sensitive component, said housing having an internal deformation shaped to receive said sealing means within.

13. The sensor of claim 12, wherein:
said magnetically sensitive component is a Hall effect element.

* * * * *